US007447944B2

(12) United States Patent
Hu

(10) Patent No.: US 7,447,944 B2
(45) Date of Patent: Nov. 4, 2008

(54) PREDICTIVE METHODS AND APPARATUS FOR NON-VOLATILE MEMORY

(75) Inventor: Carl Hu, Kokomo, IN (US)

(73) Assignee: Freescale Semiconductor, Inc., Austin, TX (US)

( * ) Notice: Subject to any disclaimer, the term of this patent is extended or adjusted under 35 U.S.C. 154(b) by 644 days.

(21) Appl. No.: 11/118,827

(22) Filed: Apr. 29, 2005

(65) Prior Publication Data

US 2006/0245248 A1 Nov. 2, 2006

(51) Int. Cl.
*G06F 11/00* (2006.01)
(52) U.S. Cl. ........................................................ 714/42
(58) Field of Classification Search .................. 714/42
See application file for complete search history.

(56) References Cited

U.S. PATENT DOCUMENTS

| 6,601,191 | B1 * | 7/2003 | Norman et al. ................ 714/37 |
| 6,711,705 | B1 * | 3/2004 | Yasui ........................... 714/723 |
| 6,714,453 | B2 | 3/2004 | Cavaleri et al. |
| 2002/0091965 | A1 | 7/2002 | Moshayedi |
| 2003/0135793 | A1 | 7/2003 | Craig et al. |

FOREIGN PATENT DOCUMENTS

WO WO 03/063176 A1 7/2003

* cited by examiner

*Primary Examiner*—Michael C Maskulinski
(74) *Attorney, Agent, or Firm*—Charles W. Bethards

(57) ABSTRACT

A system and method (700) of indicating remaining life of a Non Volatile Memory (NVM) Array can be implemented in an integrated circuit. The method includes estimating (703) the remaining life of an NVM array by characterizing one or more cells to provide an estimate; comparing (709) the estimate to a threshold to provide a comparison; and when the estimate satisfies the threshold, providing (711) an indication corresponding to the comparison. The system comprises an NVM array (201); a controller (202) configured to control the NVM array, to estimate remaining life of the NVM array by characterizing one or more cells, and to provide an output signal corresponding to life expectancy of the NVM array; and a register (215) to store a flag corresponding to the output signal, where the flag may be used to provide information corresponding to predicted life expectancy to a user.

20 Claims, 4 Drawing Sheets

PREDICTIVE METHODS AND APPARATUS FOR NON-VOLATILE MEMORY

FIELD OF THE INVENTION

This invention relates in general to memories, and more specifically to predictive methods and apparatus for non-volatile memory life expectancy.

BACKGROUND OF THE INVENTION

Non Volatile Memory (NVM) arrays, such as EEPROM (Electrically Erasable Programmable Read Only Memory) and flash EEPROM arrays are known. It is also known that these memory technologies have a finite life expectancy in terms of the number of write or write/erase cycles that may be reliably performed on any one cell of the NVM array. When these arrays are used in applications where the number of write/erase cycles can exceed the life expectancy of the array, inadvertent failures of the array may occur.

It is known to provide spare memory cells in an array that may be used as alternative storage locations when a failure of a memory cell is detected, e.g., memory cell fails to properly write. In these instances a failure occurs before an alternate location is used. Some practitioners have proposed keeping track of the remaining number of spare memory cells and taking action (alert, shutdown, etc.) if this number drops below some number of remaining spare memory cells. It has been proposed to track the number of write/erase cycles for a sector of flash EEPROM and then utilize a spare sector of the array when the number approaches a specified life expectancy for the original sector. This approach tends to be overly pessimistic for a given NVM array.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

In overview, the present disclosure concerns non-volatile memory (NVM) memories, and more specifically predictive methods and apparatus for estimating remaining life of NVM cells and arrays and, e.g., advantageously indicating this estimate when appropriate to a user relying on the NVM array. More particularly various inventive concepts and principles embodied in methods and apparatus, e.g. systems and integrated circuits, for indicating or providing a signal indicative of remaining life of an NVM cell or array will be disclosed.

The NVM memories or devices of particular interest may vary widely as most of these technologies have a finite life expectancy that in some applications may be exceeded. Where the application is important or critical, a user relying on the NVM array will likely appreciate some notice of the array approaching an end of life condition. Often these arrays or cells are organized or arranged as an EEPROM or alternatively a flash EEPROM. As is known in an EEPROM individual words (often 8 bits) can be rewritten, whereas is a flash EEPROM a complete sector (many words) must be rewritten in order to change one word or even one bit.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) including possibly application specific ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts of the various embodiments.

Figure 1:
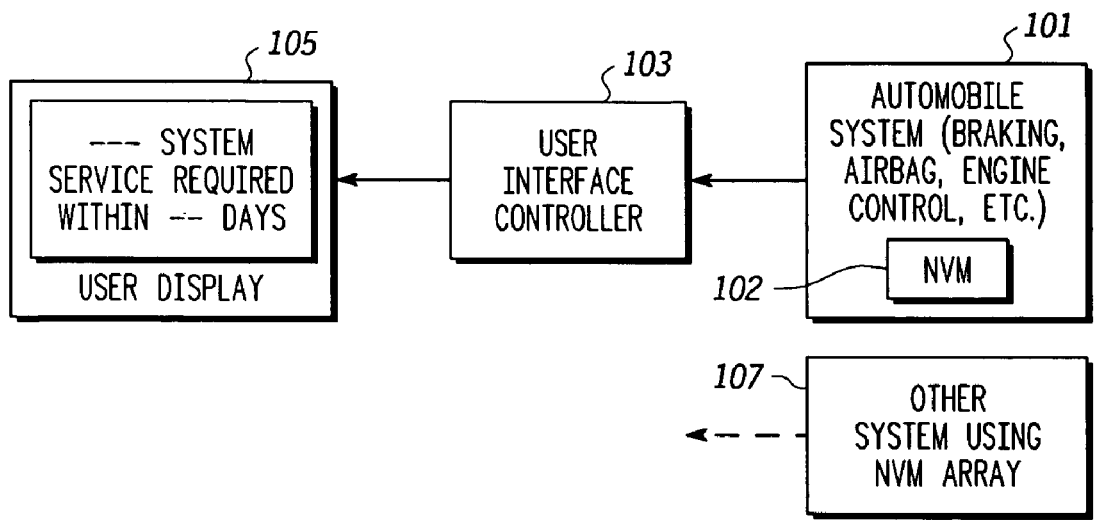
FIG. 1 depicts in a simplified and representative form, a high level diagram of a system using a Non Volatile Memory (NVM) array that uses various methods and apparatus for predicting or providing an indication of remaining life of the NVM.

Referring to FIG. 1, a simplified and representative high level diagram of a system using a Non Volatile Memory (NVM) that uses various methods and apparatus for predicting or providing an indication of remaining life of the NVM or underlying NVM array will be briefly discussed and described. In FIG. 1 a subsystem or system such as an automobile system 101 that utilizes or relies on a NVM 102 is shown. Such NVMs may be found in various automobile subsystems, such as braking, airbag, engine control systems and the like and are typically used to preserve various state information in the event power to the automobile system is interrupted. Often power is interrupted when for example the ignition is turned off or battery is otherwise disconnected or the like. Some of these systems and thus NVMs may need to be updated as conditions change during operation of the automobile. As is known, in order to update or write to an NVM or specifically the underlying NVM array the location that is written to or rewritten is first erased via an erase cycle and then a write cycle is performed. A given NVM array has a finite lifetime or life expectancy in terms of number of erase/write cycles and thus can fail as the number of cycles increases.

In FIG. 1, the automobile system 101 is shown coupled to a user interface controller 103. In accordance with one or more embodiments, the NVM array or supporting systems and thus system 101 provide an output signal or indication when an end of life condition occurs as will be further discussed below, where this signal or indication is provided prior to failure of the NVM. Thus the output or indication may be a prediction of an imminent or approaching end of life for the NVM array. The user interface controller can use this output signal or indication to initiate, provide, or generate user information, for example, on a user display 105 of the automobile or the like.

This message for the user should be suitable in one or more embodiments for informing the user relying on the NVM array of the remaining life, i.e., normally limited remaining life, of the NVM array. The message or user information can be simple, e.g., "SERVICE REQUIRED" or more elaborate, e.g. "BRAKING SYSTEM SERVICE REQUIRED" or may inform the user of a recommended period, e.g., 30 days, within which to obtain service. Note that as additional write (includes erase) cycles are performed on the NVM, the system using the NVM in certain embodiments will continue to provide or repetitively provide the indication or output signal. Note that the output signal or indication may vary with additional cycles or alternatively the interface controller 103 can count the number of occurrences.

In either event in some embodiments, the message or user information provided on the display can vary, e.g., the number of days remaining to obtain service can be changed, e.g., shortened, the message may begin to flash, or additional alarms can sound or the like. In this manner, a user can be forewarned of potential problems with an unspecified system or a specific system (braking, engine control, etc.) rather than being more or less surprised, inconvenienced, and possibly endangered by a failure of that system. It is also noted and will be appreciated that while the predictive failure approaches briefly discussed above and discussed in more detail below will or may be explained in the context of various automobile systems or subsystems, the same or similar approaches are equally and advantageously applicable to any other existing or future systems 107 employing NVMs and corresponding NVM arrays, particularly for example, where the systems may outlast the life expectancy of the NVM array.

Figure 2:
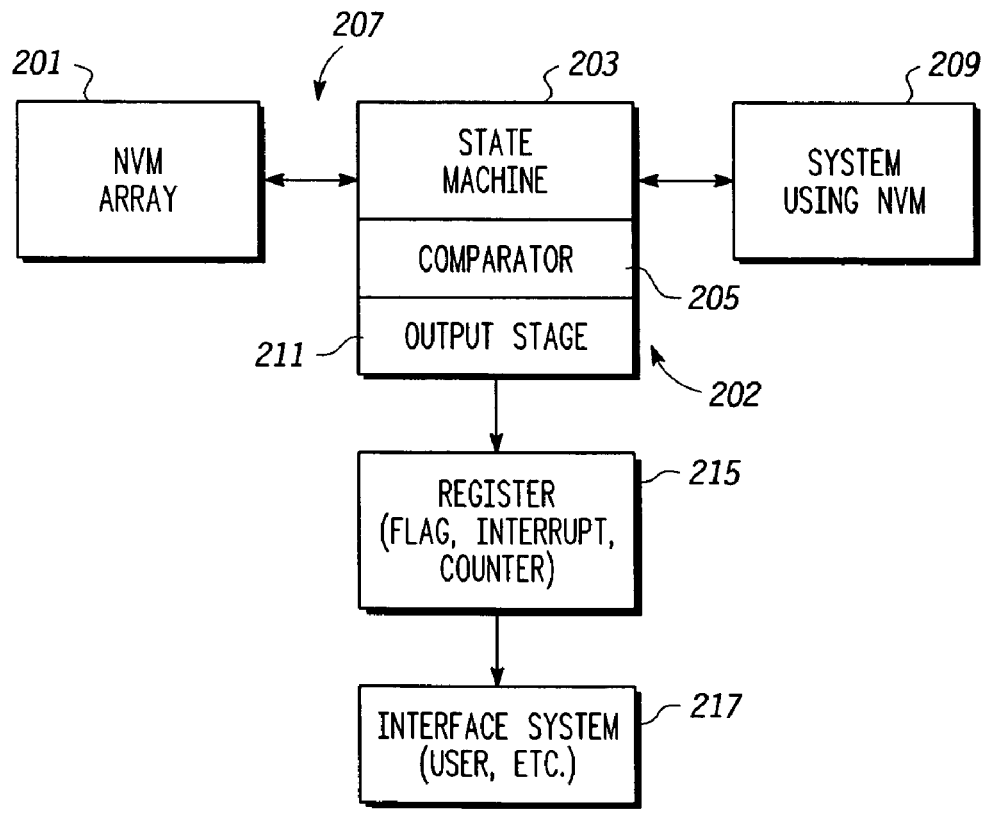
FIG. 2, in a simplified and representative form, shows a more detailed diagram of a system for providing an output corresponding to life expectancy of an NVM array.

Referring to FIG. 2, another simplified, representative, and more detailed diagram of a system for providing an output corresponding to life expectancy of an NVM array will be briefly discussed and described. The system of FIG. 2 is arranged and constructed to provide an indication that is predictive of remaining life and thus a possible near term failure of an NVM array or one or more constituent memory cells. The system comprises a Non Volatile Memory (NVM) array 201 that is coupled to controller 202. The controller 202 is configured to control the NVM array 201, to estimate remaining life of the NVM array by characterizing one or more cells of the NVM array, and to provide an output signal corresponding to life expectancy of the NVM array.

The controller in various embodiments further comprises a state machine 203 and a comparator or comparator function 205. The state machine is generally configured and operable to control the NVM array and perform erase, write, and read cycles and the like. The comparator and respective outputs may be used by the state machine to insure that various cycles result in appropriate results (cells erased, written or read, etc.). Collectively the NVM array 201, state machine 203, and in some embodiments, comparator 205 comprises a non volatile memory (NVM) 207. The NVM 207 is coupled to a system that uses or relies on the NVM 209, e.g. an engine control system or the like.

The FIG. 2 system further comprises a register 215. The output signal from the controller 202, e.g., certain outputs from the comparator 205, is coupled in some embodiments by an output stage 211 to the register 215. The register 215 is arranged and configured to store a flag corresponding to the output signal and may also include or store an interrupt enable bit or signal as well as a counter. The register and corresponding contents are coupled to an interface system 217. Generally the NVM array 201, controller 202, system using NVM 209 and register 215 are analogous to the automobile system 101 or other system 107 of FIG. 1, while the interface system 217 is analogous to the interface controller 103 and possibly display 105 of FIG. 1.

The controller further comprising in certain embodiments the state machine 203 and the comparator function 205 that are configured to characterize the one or more cells, e.g., assess a read margin for one or more cells in the NVM array 201, where the read margin corresponds to the life expectancy or remaining life of the NVM array. Note as is known a read margin corresponding to and sometimes referred to a voltage threshold essentially corresponds to the strength of a signal that is read back from a cell when the cell is read or more specifically the difference between this strength and some minimum strength. Note that the state machine and the comparator function can assess a read margin during or as part of a write cycle or assess a read margin during or as part of a read cycle. In practice, as further noted below with reference to FIG. 3, a read signal is compared to one or more thresholds, e.g., read or write thresholds, etc. with the result being used to develop or provide the output signal.

The controller or more specifically output stage 211 is configured to provide the output signal when the read margin falls below a predetermined level, where the predetermined level is selected to correspond to and be predictive of an end of life condition for one or more cells in the NVM array. The controller in some embodiments is arranged to provide the output signal on each write cycle of the NVM array after the life expectancy of the NVM array reaches a predicted end of life condition. For example, suppose the predetermined level is selected to correspond to 16 (alternatively 100 or 10) more erase/write cycles. Then after the predetermined level is satisfied by the read margin or read signal, on each write cycle thereafter the output signal would be provided. The register in certain embodiments can store a flag that is used to enable an interrupt on each occurrence of the output signal, where the interrupt is used, e.g., by the interface system 217 to inform a user relying on the NVM array of the approaching end of life of the NVM array. As additional occurrences of the output signal are noted the user may be provided with additional messages or warnings and these messages or warnings may include increasing levels of urgency. The register in other embodiments may further comprises a counter that counts the occurrences of the output signal or more specifically a down counter that is preloaded with the expected number of additional erase/write cycles (16, 100, 10) and on each occurrence of the output signal this count is decremented.

It will be appreciated that the system of FIG. 2 may be implemented as one or more integrated circuits and may be viewed as an integrated circuit comprising a Non Volatile Memory (NVM) array and a state machine configured to control the NVM array and characterize one or more cells of the NVM array; a predictive function, coupled to the state machine and configured to assess a remaining life of the NVM array and provide an output signal when a predicted end of life condition occurs; and a register configured to store a flag corresponding to the output signal. The predictive function in some embodiments further comprises a comparator to provide the output signal when an estimate of the remaining life of the NVM array satisfies the predicted end of life condition. The comparator compares a read signal to one or more thresholds to determine a read margin, where the read margin corresponds to the remaining life of the NVM array.

Figure 3:
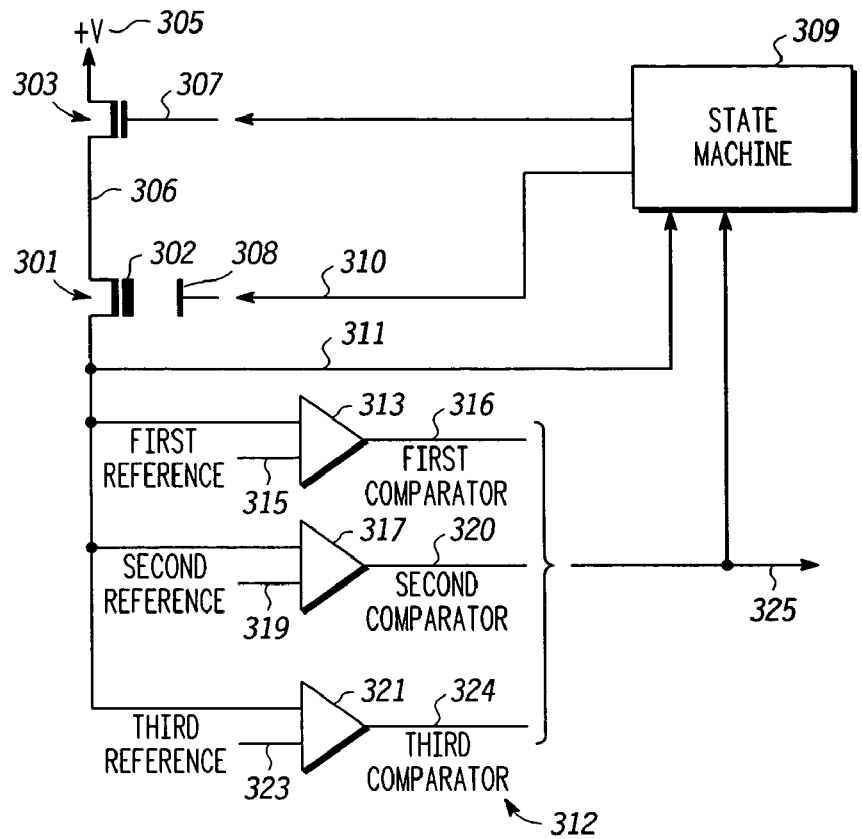
FIG. 3 depicts, a representative embodiment of a cell in an NVM array with means to estimate remaining life of the cell.

Referring to FIG. 3, a representative embodiment of a cell in an NVM array with means to estimate remaining life of the cell will be discussed and described. FIG. 3 shows a representative memory cell or cell 301 with a floating gate 302. It is understood that one cell is shown and an array may comprises a multiplicity, e.g., millions of such cells. Note that these cells may be formed from either a p-channel or n-channel device. For these discussions an n-channel device or cell will be assumed without loss of generality. As is known, charge or the amount of the charge that is stored on the floating gate 302 will determine whether a channel is formed in the memory cell when it is selected. Selection circuitry, representatively shown as a selection transistor 303 is coupled at the source to a bias voltage 305. This transistor is enabled by a positive signal at the gate 307. As is known address decoders that may be viewed as part of the state machine 309 will generate the signal at the gate 307 whenever the cell 301 is to be selected. Additionally shown is a control gate 308 that is coupled at 310 to a control signal from the state machine 309. Bias on the control gate 308 among other bias arrangements not specifically shown are normally used to write or erase a given cell in an EEPROM or sector of cells in a flash EEPROM, i.e. add to or detract from the charge that is stored on the floating gate all as known. By appropriately characterizing one or more of these cells during "normal" operation of the NVM array a prediction of the remaining life or near term failure of the NVM array can be made and used, for example, to warn a user of the NVM array.

When the selection transistor 303 is enabled or turned on by the signal at the gate 307, the bias voltage or nearly the bias voltage will be coupled to the source 306 of the cell 301. If the charge on the floating gate 302 is sufficiently positive a channel will be formed in the cell 301, the cell will conduct, and this bias voltage or significant portion thereof will be coupled to the drain 311 of the cell and back to the state machine 309 or more specifically one or more sense amplifiers (not specifically shown). If the charge on the floating gate is zero or negligible, no channel is formed and the bias voltage is not coupled to the drain of the cell. The signal at the drain 311 of the cell 301 may be referred to as a read signal or at least corresponds to a read signal. By one convention, when the channel is formed and the cell conducts the cell is storing a logic "1" and when it does not conduct, the cell is storing a logic "0".

As is also known and as a result among others of charge trapping typically in the gate oxide or the like, when a cell is repetitively erased and then written or rewritten the amount of apparent charge that is stored on the floating gate will decrease for a positive charge and increase for a zero or negligible charge. Thus the magnitude of the signal or portion of the bias voltage that is coupled to the drain of the cell 301 (when the cell is selected) will decrease when a channel is supposed to be formed (floating gate carries a positive charge for n-channel cells, i.e. a "1" is stored) and increase when a channel is not supposed to be formed (i.e., a "0" is stored). At some point as the number of cycles increases, it is no longer easy to distinguish the signal at the drain (i.e., read signal) when a "1" is stored from that signal when a "0" is stored.

The difference between this "1" signal and "0" signal may be referred to as a voltage threshold in the NVM field and this threshold will normally decrease with the number of write cycles a given cell experiences. A read margin can be referred to as the difference between an observed read signal magnitude and one or more predetermined levels or thresholds. For example when a "1" is stored the difference between the observed signal at the drain 311 of the cell 301 and a lower threshold, i.e. first read threshold, may be referred to as a read margin. When a "0" is stored the difference between an observed signal and a higher threshold, i.e., a second read threshold, may also be denoted as a read margin. The read margin can be assessed on each read or read back cycle and can also be assessed as part of an erase/write cycle, e.g., at the end of the write cycle to insure that a cell has been reliably programmed. Note that by assessing the read margins during the write cycle and during the read cycle a sense of any leakage of charge from the floating gate during the intervening time period can be gained. For our purposes we may refer to the read threshold used during a read cycle as a read threshold and the read threshold used during a write cycle as a write threshold. In present technologies the read and write thresholds may be equal or nearly equal, however in some instances it may be beneficial to distinguish between the two.

For example, in one NVM array with a bias voltage 305 of 2.5 volts, so long as a read signal exceeds 1.7 volts the cell is storing a "1" with high confidence. Similarly when the read signal is less than 0.9 volts the cell is storing a "0" with high confidence. As those of ordinary skill will appreciate, the variation or change in the voltage threshold or read margins for a given architecture and process technology is highly correlated with the number of write (erase/write) cycles a cell has undergone. Thus the read margin or read signal observed is highly indicative of or predictive of the remaining life of the NVM cell and thus NVM array. By comparing the read margin to one or more predetermined levels or thresholds or the read signal to one or more appropriate thresholds (read or write thresholds) an end of life condition can be observed and thus the remaining life of the NVM cell or array can be predicted with reasonable certainty. In the above example with a bias voltage of 2.5 volts, a read threshold of 1.4 volts may be used to compare with the read signal when a "1" is stored and a read threshold of 1.2 volts may be used to compare with the read signal when a "0" is stored. One or ordinary skill in view of data collected during the design and development phases or subsequent field experience for a given NVM cell or array will be able to determine one or more thresholds or levels that may be used to compare with the read signal or read margin to thereby predict an end of life condition or remaining life, i.e., when a cell is nearing the end of its useful life.

In view of the above discussion, FIG. 3 also depicts a threshold function 312 that is coupled to the drain 311 of the cell 301 and thus the read signal from the cell. The threshold function includes: a first comparator 313 that is referenced to a first reference at 315 and provides a positive output at 316 when the read signal exceeds the first reference; a second comparator 317 that is referenced to a second reference at 319 and provides a positive output at 320 when the read signal exceeds the second reference; and a third comparator 321 that is referenced to a third reference at 323 and provides a positive output at 324 when the read signal exceeds the third reference. The outputs of the comparators are coupled to the state machine 309 as well as, for example, an output stage (see FIG. 2). Note that additional comparators can be provided for characterizing additional parameters corresponding to the cell 301.

For example, suppose a "1" is stored in the cell 301. When the cell is read the read signal may be expected to exceed all references and thus the output signal from each of the three comparators would be positive. If the read signal did not exceed the first reference but did exceed all other references the output of the first comparator would be zero and all others would be positive. This may be used as an indication or predictive indication that the cell 301 is nearing an end of life condition and may be expected to fail within the next so many cycles. Suppose a "0" is stored in the cell 301. When the cell is read, the read signal may be expected to be less than all references and thus the output signal from each of the comparators would be zero. If the read signal exceeded for example the third reference the output from the third comparator 324 would be positive and all others would be zero. This may also be used as an indication that the cell 301 is nearing an end of life condition. Thus by selecting the proper references and proper comparator to monitor or by monitoring all of the comparators and interpreting the results of the outputs of the comparators, e.g. in the state machine or output stage, an estimate of or prediction of the remaining life of the cell can be made. Note that other comparators and references may need to be relied upon when the read signal is being assessed as part of a write cycle versus as part of a read cycle.

Figure 4:
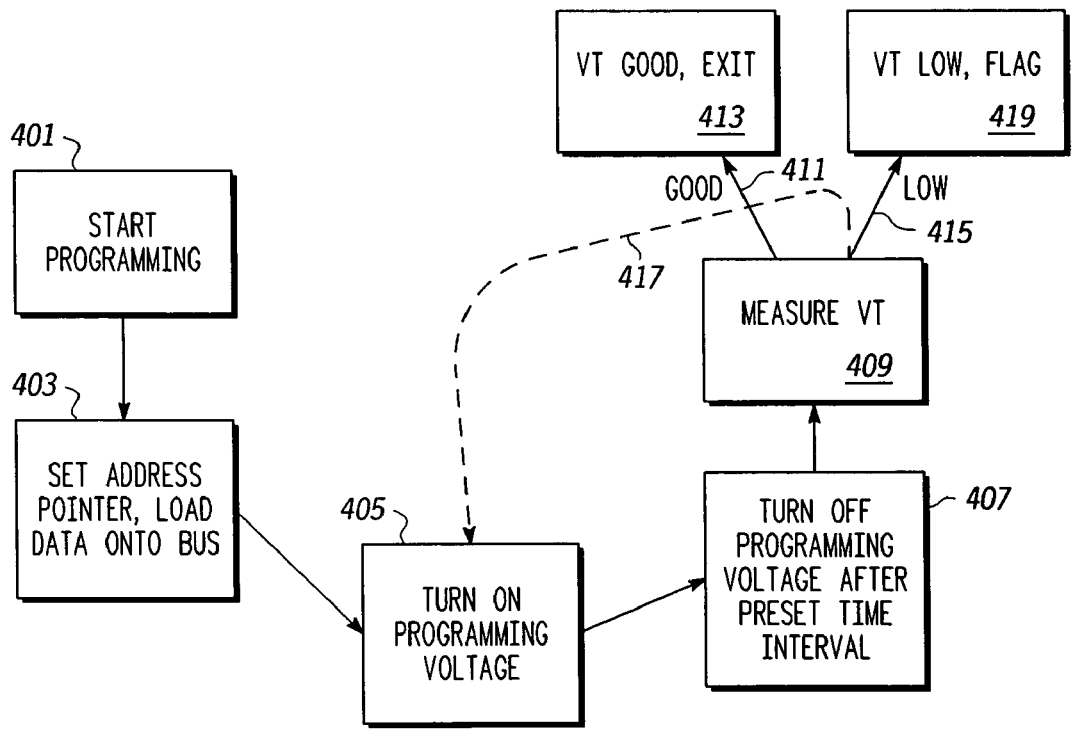
FIG. 4 depicts one representative aspect of the operation of a state machine controlling an NVM array.

Referring to FIG. 4, one representative aspect of the operation of a state machine controlling an NVM array will be discussed and described. In FIG. 4 a flow chart of the processes that can be used to program or write to a memory cell are shown. Note that an analogous process is used to erase a memory cell or sector of memory cells and this is done prior to programming the cells. The operation of the controller or state machine begins at 401 with 403 showing setting the address pointers and loading data onto a bus for the corresponding cells. Then at 405 the programming voltage is turned on and subsequently turned off after a preset time interval at 407, where this time interval is selected to insure that sufficient charge is stored on the floating gates of the memory cells of the array. In some arrays the programming voltage is turned off based on a threshold voltage reaching a particular level.

At 409 the voltage threshold is measured. As noted earlier this is analogous to measuring the read margin or read signal when the cells are read and comparing to an expected value or threshold (write threshold for either "1" or "0"). When the voltage threshold is measured and compared to an expected value it will be found to be good 411 or low at 415. When it is deemed to be low 417 indicates that some embodiments allow the programming step at 405, 407 to be repeated. If the voltage threshold is good, the programming is over and 413 shows exiting the programming process. If the voltage threshold is deemed to be low, 419 indicates that a flag is set suggesting that an end of life situation for the array is approaching. Note that normally if one voltage threshold is good, then full performance is indicated, while if one or more low levels are found, these can be interpreted as signs of wear out for the NVM array.

Figure 5:
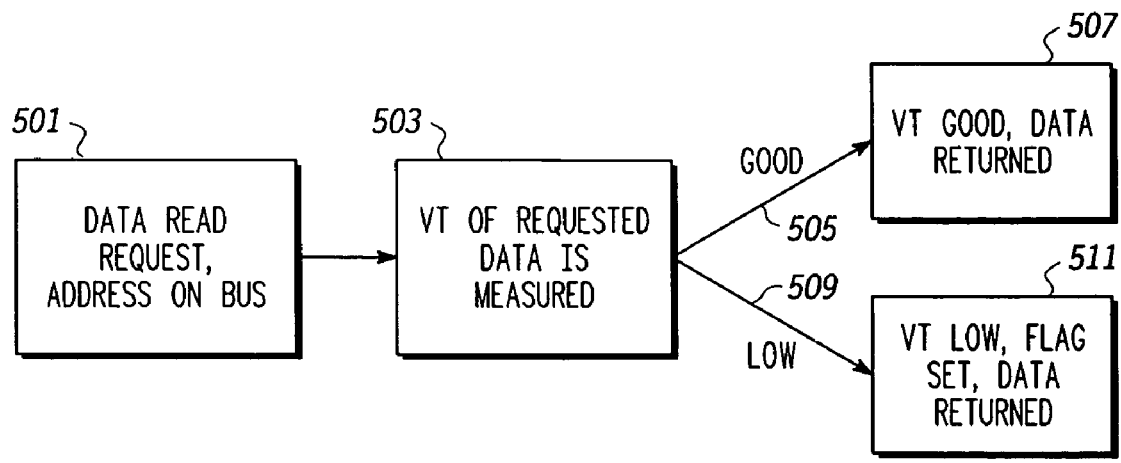
FIG. 5 depicts another representative aspect of the operation of a state machine controlling an NVM array.

Referring to FIG. 5, another representative aspect of the operation of a state machine controlling an NVM array will be described and discussed. In FIG. 5 depicts processes at a high level that the controller or state machine will execute as part of a read or read back cycle. At 501 a data read request is received and the appropriate address is loaded to the bus. At 503 the voltage threshold corresponding to the requested data is measured in accordance with the concepts and principles noted above or similar approaches that are being proposed with new NVM array designs. If the voltage threshold is deemed to be good 505 the data is returned at 507. If the voltage threshold is deemed to be low 509, a flag is set and the data is returned 511. The flag indicates that an end of life condition has been detected and this is a prediction of remaining life of the NVM array. Note that the voltage threshold measurements can be the same or similar to those that are presently employed or soon to be employed. Thus these measurements can provide a dual use, e.g., their normal purposes of insuring data integrity as well as their predictive purposes of forecasting end of life conditions for one or more cells in an NVM array, where this prediction or forecast can be advantageously used as earlier noted to warn a user relying on the NVM array.

Figure 6:
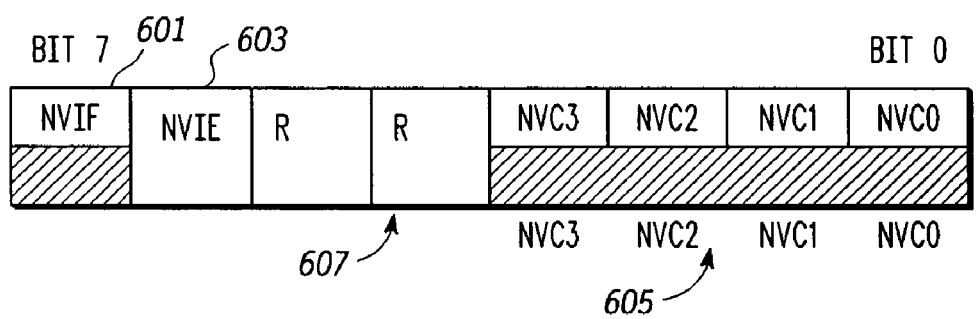
FIG. 6 shows one embodiment of a register suitable for use in the FIG. 2 system.

Referring to FIG. 6, one embodiment of a register suitable for use in the FIG. 2 system according to one or more embodiments will be discussed and described. As depicted the register of FIG. 6 is an 8 bit register, however the register can be as long as a practitioner desires. Bit 7 is a Non Volatile Information Flag (NVIF) 601 where this bit is set when, e.g., an end of life condition is detected. For example, if a predetermined threshold is satisfied by the read margin, voltage threshold, or read signal, where the threshold corresponds to 16 write cycles remaining this flag may be set, for example, to one. The output signal(s) noted above may be used to set this flag. Bit 6 as shown is a Non Volatile Interrupt Enable (NVIE) bit that when set, may be used to cause an interrupt to be generated (thereby causing a message or the like to be displayed to a user), for example, each time a write cycle is performed once the NVIF bit is set. Further shown is a counter 605 (counter output bits) that uses 4 bits and thus can count, for example, down from a binary value of 15 yielding 16 states. Two bits are reserved bits 607 and may be used if a longer counter is desired or different levels of interrupt or flags need to be identified.

Figure 7:
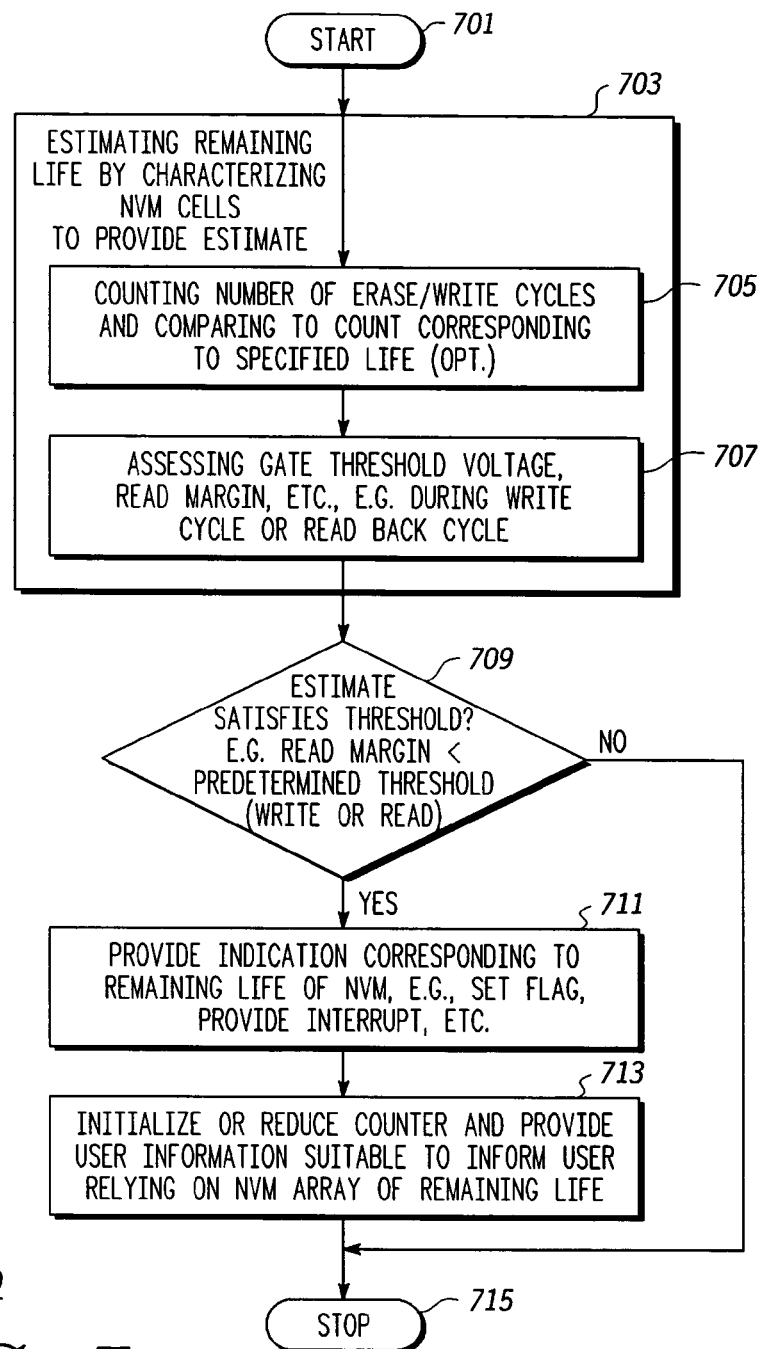
FIG. 7 illustrates an exemplary embodiment of a flow chart of a method embodiment of indicating remaining life of an NVM array.

Referring to FIG. 7, an exemplary embodiment of a flow chart of a method embodiment of indicating remaining life of an NVM array will be discussed and described. It will be appreciated that this method uses many of the inventive concepts and principles discussed in detail above and thus this description will be somewhat in the nature of a summary with the details generally available in the earlier descriptions. This method can be implemented in one or more of the structures or apparatus described earlier or other similarly configured and arranged structures.

The method 700 of indicating remaining life of a Non Volatile Memory (NVM) Array begins at 701 and comprises estimating 703 the remaining life of an NVM array by characterizing one or more cells to provide an estimate. The estimating 703 in various embodiments may optionally include counting 705 the number of erase/write cycles and comparing this count to a count corresponding to a specified life for the NVM array or some portion of that life and assessing 707 a gate threshold voltage (voltage threshold from above), read margin, read signal magnitude, etc. during, e.g., at the end of a write cycle or as part of or during a read cycle. The method further comprises comparing 709 the estimate to a threshold to provide a comparison, e.g., determining whether the estimate satisfies a threshold. For example is the read margin or read signal less than a predetermined threshold (read threshold or write threshold) and when the estimate satisfies the threshold, providing 711 an indication corresponding to the comparison, such as the remaining life of the NVM array. This may include setting a flag and enabling an interrupt, etc. The method may also include initializing or reducing a counter value and providing information suitable to inform a user relying on the NVM of the remaining life of the array 713. The method ends at 715 but may be repeated as needed, e.g., each time there is a write cycle of the array. When the comparing 709 determines that the threshold is not satisfied by the estimate the method ends at 715.

Thus the estimating the remaining life in one or more embodiments further comprises assessing a read margin for one or more cells in the NVM array to provide the estimate and this may occur during a read cycle or write cycle. The comparing the estimate to a threshold in some embodiments further comprises comparing a read signal for one or more cells in the NVM array to a predetermined threshold, e.g. a write threshold during a write cycle or read threshold during a read cycle. As suggested the method may further comprises initiating, responsive to the indication, a down counter with a remaining number of write cycles for the NVM array and reducing the remaining number of write cycles as each write cycle is performed. The providing the indication can further comprise providing user information that is suitable for informing a user relying on the NVM array of the remaining life of the NVM array.

Figure 8:
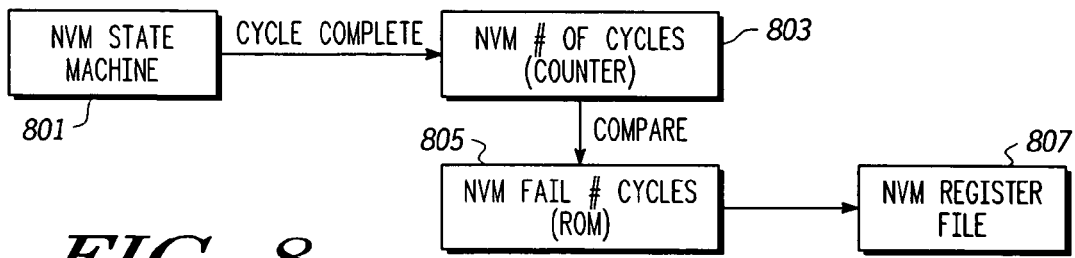
FIG. 8 illustrates an embodiment for counting NVM cycles.

Referring to FIG. 8 an embodiment for counting NVM write or erase/write cycles will be discussed and described. In FIG. 8, an NVM state machine 801 provides an indication each time a cycle has been completed. These indications are counted in a counter 803. The number of NVM cycles that have been performed are then compared at block 805 to a predetermined count, e.g., the specified life of the NVM or the specified life less a 100 cycles or so that is stored in read only memory (not user accessible). When the cycle count exceeds the specified or predetermined count an output is provided to an NVM register and can be used to start a down counter and initiate a warning or corresponding notice to a user relying on the NVM array. This counter and counting technique may also be used to distinguish infant mortality or earlier failures that are likely dealt with by other means (spare cells or sectors or the like) from end of life conditions. For example, if the counter indicates that less than half of the specified life has been used, any failure or near term failure that is detected is likely an infant mortality issue and arguably can be ignored, i.e. dealt with via other means. As noted in the discussion of the method 700 the counting of cycles 705 may be used to augment the estimating process 703.

The processes, apparatus, and systems, discussed above, and the inventive principles thereof are intended to and can alleviate problems caused by prior art NVM arrays. Using these principles of estimating remaining life of one or more cells in an NVM array and providing a warning to a user once an end of life is predicted will facilitate application of NVMs in more critical applications without undue costs and the like associated with additional longer lived NVMs. By actually characterizing cells as they are being used a much more accurate prediction of remaining life can be made, than by merely counting write cycles. For a given NVM array the life expectancy is ordinarily significantly longer than the specified life expectancy and using the above discussed techniques and systems will allow a given user to take advantage of this typically significantly longer life if need be. This will lower average costs for all users that rely on NVM arrays as well as help to avoid inconvenience and possibly personal risk resulting from a failure do to an NVM reaching the end of its life without any warning. Note that the use of NVMs is growing and the application of the inventive techniques, concepts, and principles discussed and described herein is expected to be broad based.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method of indicating remaining life of a Non Volatile Memory (NVM) Array, the method comprising:
    estimating the remaining life of an NVM array by characterizing one or more cells to provide an estimate, wherein the estimating the remaining life further comprises assessing a read margin for one or more cells in the NVM array to provide the estimate;
    comparing the estimate to a threshold to provide a comparison; and
    when the estimate satisfies the threshold, providing an indication corresponding to the comparison.

2. The method of claim 1 wherein the estimating the remaining life further comprises assessing the read margin during a write cycle.

3. The method of claim 1 wherein the estimating the remaining life further comprises assessing the read margin during a read cycle.

4. The method of claim 1 wherein the comparing the estimate to a threshold further comprises comparing a read signal for one or more cells in the NVM array to a predetermined threshold.

5. The method of claim 4 wherein the comparing the read signal for one or more cells in the NVM array to a predetermined threshold further comprises comparing the read signal during a write cycle to a write threshold.

6. The method of claim 4 wherein the comparing the read signal for one or more cells in the NVM array to a predetermined threshold further comprises comparing the read signal during a read cycle to a read threshold.

7. The method of claim 1 further comprising initiating, responsive to the indication, a down counter with a remaining number of write cycles for the NVM array and reducing the remaining number of write cycles as each write cycle is performed.

8. The method of claim 1 wherein the providing the indication further comprises providing user information that is suitable for informing a user relying on the NVM array of the remaining life of the NVM array.

9. The method of claim 1 further comprising:
    initiating, responsive to the indication, a down counter with a remaining number of write cycles for the NVM array and reducing the remaining number of write cycles as each write cycle is performed; and
    wherein the providing the indication further comprises providing user information that is suitable for informing a user relying on the NVM array of the remaining life of the NVM array, the user information varying as the remaining number of write cycles is reduced.

10. A system comprising:
a Non Volatile Memory (NVM) array,
a controller configured to control the NVM array, to estimate remaining life of the NVM array by characterizing one or more cells of the NVM array, and to provide an output signal corresponding to life expectancy of the NVM array, the controller further comprising;
 a state machine and a comparator function configured to assess a read margin for one or more cells in the NVM array, the read margin corresponding to the life expectancy of the NVM array; and
a register to store a flag corresponding to the output signal.

11. The system of claim 10 wherein the state machine and the comparator function assess a read margin during a write cycle.

12. The system of claim 10 wherein the state machine and the comparator function assess a read margin during a read cycle.

13. The system of claim 10 wherein the controller further comprises an output stage configured to provide the output signal when the read margin falls below a predetermined level, the predetermined level selected to be predictive of an end of life condition for the one or more cells in the NVM array.

14. The system of claim 10 wherein the controller provides the output signal on each write cycle of the NVM array after the life expectancy of the NVM array reaches a predicted end of life condition.

15. The system of claim 14 wherein the register further stores a flag used to enable an interrupt on each occurrence of the output signal, the interrupt used to inform a user relying on the NVM array of the approaching end of life of the NVM array.

16. The system of claim 14 wherein the register further comprises a counter that counts the occurrences of the output signal.

17. An integrated circuit comprising:
a Non Volatile Memory (NVM) array and a state machine configured to control the NVM array and characterize one or more cells of the NVM array;
a predictive function, coupled to the state machine and configured to assess a remaining life of the NVM array based on a read margin of one or more cells of the NVM array and provide an output signal when a predicted end of life condition occurs; and
a register configured to store a flag corresponding to the output signal.

18. The integrated circuit of claim 17 wherein the predictive function further comprises a comparator to provide the output signal when an estimate of the remaining life of the NVM array satisfies the predicted end of life condition.

19. The integrated circuit of claim 18 wherein the comparator compares a read signal to one or more thresholds to determine the read margin, the read margin corresponding to the remaining life of the NVM array.

20. The integrated circuit of claim 17 wherein the register further comprises a counter that counts the occurrences of the output signal.

* * * * *